(12) United States Patent
Hilsenbeck et al.

(10) Patent No.: US 9,633,957 B2
(45) Date of Patent: Apr. 25, 2017

(54) SEMICONDUCTOR DEVICE, A POWER SEMICONDUCTOR DEVICE, AND A METHOD FOR PROCESSING A SEMICONDUCTOR DEVICE

(71) Applicant: Infineon Technologies AG, Neubiberg (DE)

(72) Inventors: Jochen Hilsenbeck, Villach (AT); Jens Peter Konrath, Villach (AT); Thomas Frank, Villach (AT); Roland Rupp, Lauf (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/555,736

(22) Filed: Nov. 28, 2014

(65) Prior Publication Data
US 2016/0155714 A1   Jun. 2, 2016

(51) Int. Cl.
| H01L 23/532 | (2006.01) |
| H01L 23/00 | (2006.01) |
| H01L 23/31 | (2006.01) |
| H01L 23/58 | (2006.01) |
| H01L 29/43 | (2006.01) |

(52) U.S. Cl.
CPC .......... *H01L 24/05* (2013.01); *H01L 23/3121* (2013.01); *H01L 23/585* (2013.01); *H01L 29/43* (2013.01); *H01L 2224/05082* (2013.01); *H01L 2224/05124* (2013.01); *H01L 2224/05623* (2013.01); *H01L 2224/05624* (2013.01); *H01L 2924/0103* (2013.01); *H01L 2924/0105* (2013.01); *H01L 2924/01014* (2013.01); *H01L 2924/01025* (2013.01); *H01L 2924/01029* (2013.01); *H01L 2924/1203* (2013.01); *H01L 2924/1301* (2013.01); *H01L 2924/1305* (2013.01); *H01L 2924/1306* (2013.01); *H01L 2924/13055* (2013.01)

(58) Field of Classification Search
CPC ................................... H01L 23/5329
See application file for complete search history.

(56) References Cited

U.S. PATENT DOCUMENTS

| 7,164,572 B1* | 1/2007 | Burdon et al. ......... 361/302 |
| 2003/0137058 A1* | 7/2003 | Magerlein .......... H05K 1/112 257/784 |
| 2009/0212433 A1* | 8/2009 | Yang ............. H01L 21/76847 257/751 |

(Continued)

OTHER PUBLICATIONS

"Final Datasheet,—Silicon Carbide—Junction Field Effect Transistor", Infineon, Sep. 11, 2013, 20 pages.

(Continued)

*Primary Examiner* — Fernando L Toledo
*Assistant Examiner* — Neil Prasad
(74) *Attorney, Agent, or Firm* — Viering, Jentschura & Partner mbB

(57) ABSTRACT

According to various embodiments, a semiconductor device may include: a layer stack formed at a surface of the semiconductor device, the layer stack including: a metallization layer including a first metal or metal alloy; a protection layer covering the metallization layer, the protection layer including a second metal or metal alloy, wherein the second metal or metal alloy is less noble than the first metal or metal alloy.

19 Claims, 7 Drawing Sheets

(56) References Cited

U.S. PATENT DOCUMENTS

| | | | |
|---|---|---|---|
| 2011/0031537 A1* | 2/2011 | Widenmeyer et al. | 257/253 |
| 2011/0115068 A1* | 5/2011 | Hartung et al. | 257/690 |
| 2013/0043593 A1* | 2/2013 | Domes | 257/758 |
| 2014/0308602 A1* | 10/2014 | Nishikawa | H01M 8/0206 429/520 |
| 2015/0028461 A1* | 1/2015 | Gatterbauer | H01L 24/05 257/666 |
| 2015/0207153 A1* | 7/2015 | Harkness | H01M 4/8657 502/5 |
| 2016/0013494 A1* | 1/2016 | Arihara | H01M 4/92 429/524 |

OTHER PUBLICATIONS

Siemieniec et al., "The 1200V Direct-Driven SiC JFET power switch", Birmingham, ISBN: 9789075815153, 2011, 10 pages.

\* cited by examiner

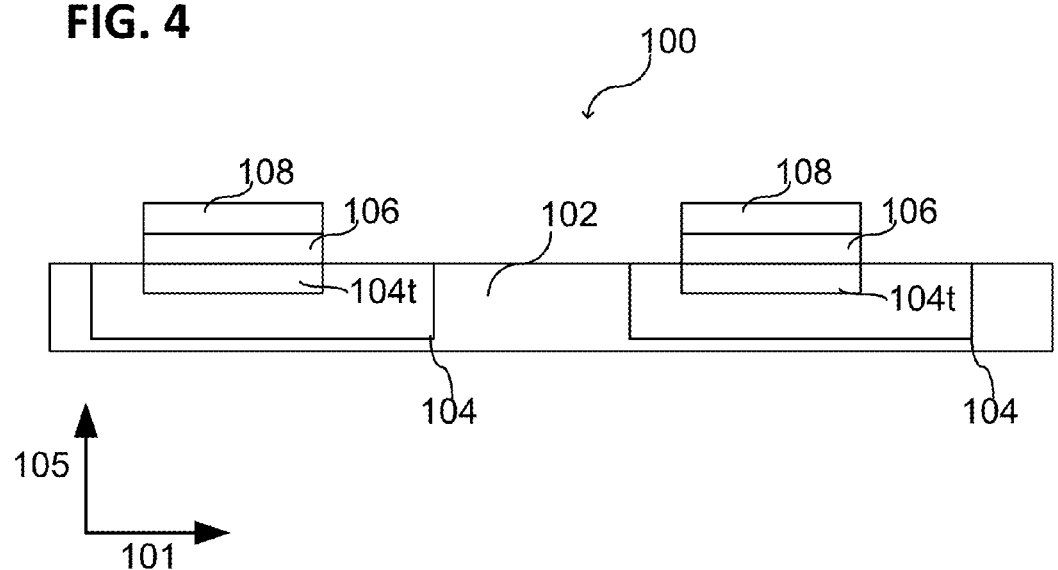
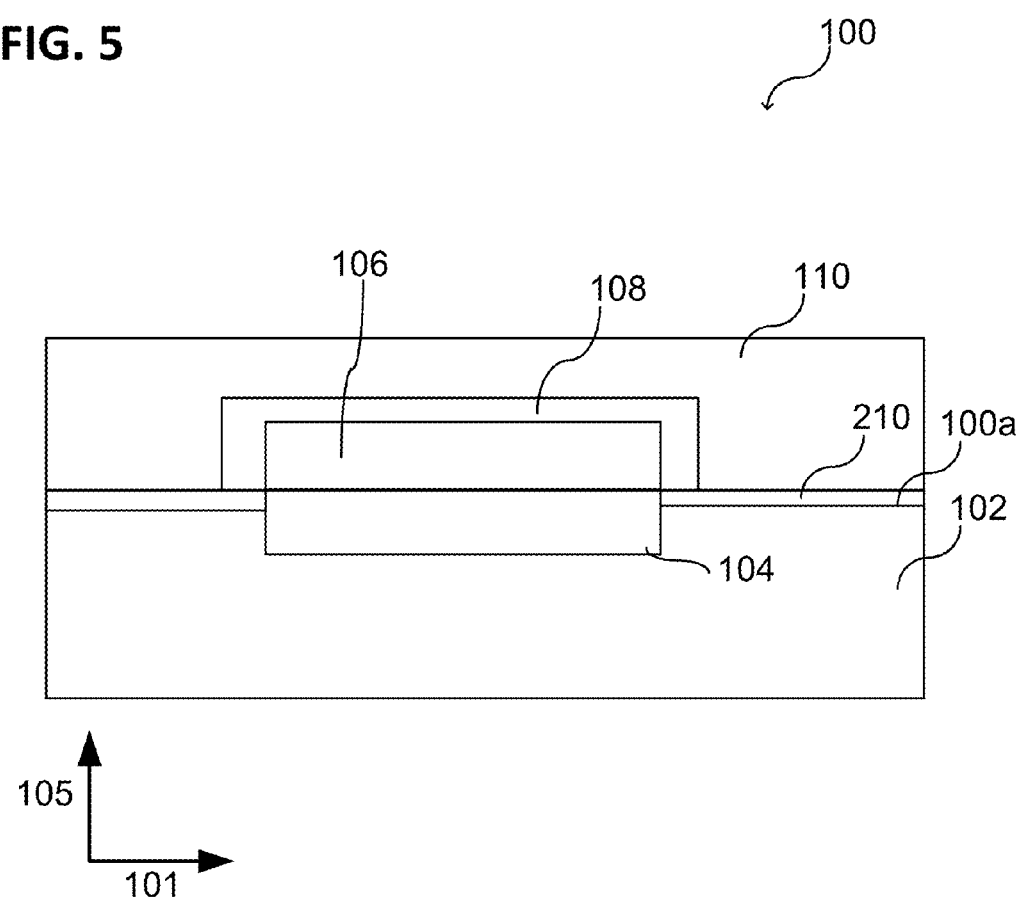

SEMICONDUCTOR DEVICE, A POWER SEMICONDUCTOR DEVICE, AND A METHOD FOR PROCESSING A SEMICONDUCTOR DEVICE

TECHNICAL FIELD

Various embodiments relate generally to a semiconductor device, a power semiconductor device, and a method for processing a semiconductor device.

BACKGROUND

In general, a semiconductor substrate, a semiconductor wafer, or another suitable carrier may be processed in semiconductor technology to form an integrated circuit or a semiconductor device based on at least one integrated circuit structure. A semiconductor wafer may be used for processing a plurality of integrated circuits at a surface of the wafer and, after processing, the wafer may be diced to provide a plurality of dies or chips from the wafer. Finally, the dies or chips being singulated from the wafer (so called bare dies or bare chips) may be packaged in a packaging process, wherein the dies or chips may be encased in a supporting material or in a housing to prevent, for example, physical damage and/or corrosion. The housing (also called package or case) may also support the electrical connections used to connect the device, for example, to a circuit board. Typically, a die or a chip includes a metallization for controlling or operating the integrated circuit. Terminals of an integrated circuit structure (e.g. a source terminal, a drain terminal, and/or a gate terminal of a field effect transistor or an emitter terminal, a collector terminal, and/or a base terminal of a bipolar transistor, or two terminals of a diode) may be contacted by the metallization to control or operate the integrated circuit structure. A metallization may include a front side metallization and/or a back side metallization. Further, a metallization may include a patterned metal or a patterned metallic material (typically provided in copper technology or in aluminum technology) which may provide one or more electrical contacts (contact pads) and a wiring. Further, the metallization may electrically contact a single integrated circuit structure (e.g. a transistor or a diode). Alternatively, the metallization may electrically contact a plurality of integrated circuit structures of a chip (e.g. a plurality of transistors or a plurality of diodes), wherein the metallization may support or may provide the functionality of the chip due to the specific wiring structure.

SUMMARY

According to various embodiments, a semiconductor device may include: a layer stack formed at a surface of the semiconductor device, the layer stack including: a metallization layer including a first metal or metal alloy; a protection layer covering the metallization layer, the protection layer including a second metal or metal alloy, wherein the second metal or metal alloy is less noble than the first metal or metal alloy.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 4 shows a semiconductor device in a schematic cross sectional view according to various embodiments;

FIG. 5 shows a semiconductor device in a schematic cross sectional view according to various embodiments;

DESCRIPTION

Figure 1A:
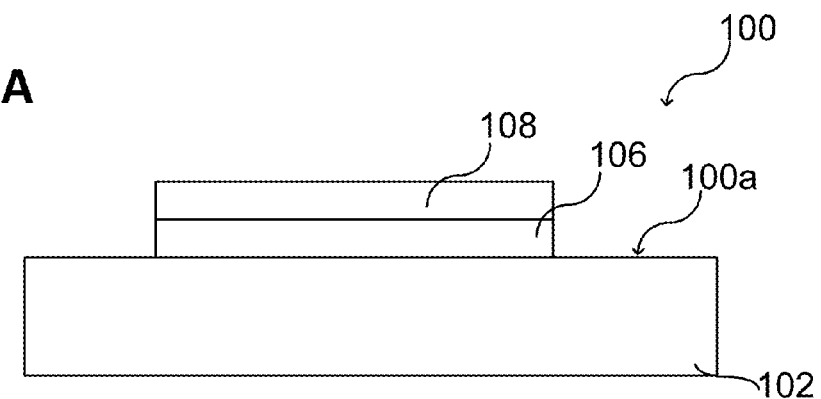
FIG. 1A shows a semiconductor device in a schematic cross sectional view according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a structure element) provided at least one of on or in a carrier (e.g. a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

According to various embodiments, a carrier (e.g. a substrate, a wafer, or a work piece) may be made of or may include semiconductor materials of various types, including, for example, silicon, germanium, Group III to V or other types, including polymers, for example, although in another embodiment, other suitable materials can also be used. In an embodiment, the carrier is made of silicon (doped or undoped), in an alternative embodiment, the carrier is a silicon on insulator (SOI) wafer. As an alternative, any other suitable semiconductor materials can be used for the carrier, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may be a thin or an ultrathin substrate or wafer, e.g. with a thickness in the range from about several micrometers to about several tens of micrometers, e.g. in the range from about 5 µm to about 50 µm, e.g. with a thickness less than about 100 µm or less than about 50 µm. According to various embodiments, a carrier may include SiC (silicon carbide) or may be a silicon carbide carrier, a silicon carbide substrate, a silicon carbide wafer, or a silicon carbide work piece. The silicon carbide may be, for example, n-type doped (e.g. with nitrogen) and may be used for manufacturing power devices.

The term "power" used with regards to a "power" device, "power" integrated circuit structure, or "power" metallization, as well as "power" integrated circuit, "power" transistor, "power" diode, and the like, may be used herein to mean that the device, the circuit structure, or the metallization may be configured to handle high electrical currents, e.g. electrical currents greater than about 1 A, 2 A, 5 A or 10 A; or electrical currents in the range from about 1 A to about 1000 A, or electrical currents even greater than about 1000 A, and to handle high electrical voltages, e.g. electrical voltages greater than 20 V. 30 V, 50 V, or 100 V; or electrical voltages in the range from about 20 V to about 10 kV, or electrical voltages even greater than about 10 kV. According to various embodiments, a power device may be operated as switch or as rectifier. Further, a power device may be capable of carrying high current and may have a high reverse blocking voltage (e.g. the reverse blocking voltage may be greater than about 20 V, 30V, 100 V or 1000 V; or even greater than about 1000 V).

According to various embodiments, a single metal line or contact pad of a power metallization for contacting a power semiconductor device (e.g. for contacting a power transistor or a power diode) may be able to transport an electrical current greater than about 1 A, 2 A, 5 A, or 10 A. According to various embodiments, in the manufacture or design of a power metallization, aspects, like for example, electro migration, heat dissipation, and thermal stability are to be considered.

A semiconductor device, a semiconductor power device, or an integrated circuit structure, as referred to herein, may be or may include at least one of the following: a two terminal device, e.g. a diode (a PIN diode or a Schottky diode, e.g. a SiC Schottky diode), and/or a three terminal device, e.g. a power MOSFET (metal oxide semiconductor field-effect transistor), a JFET (junction gate field-effect transistor), e.g. a SiC JFET, a thyristor (e.g. in metal oxide semiconductor (MOS) technology), an IGBT (insulated-gate bipolar transistor), and the like. Further, the semiconductor device, the semiconductor power device, or the integrated circuit structure as referred to herein may be or may include any other suitable multi terminal device, e.g. with four or more than four terminals, e.g. a transmitter device, a receiver device, a transceiver device, an RF—(radio frequency)—switch, and the like.

Encapsulating or partially encapsulating an integrated circuit structure or semiconductor work piece, as referred to herein, may also be understood as packaging. According to various embodiments, a semiconductor device, e.g. a semiconductor power device, may include at least one integrated circuit structure, e.g. one or more encapsulated or packaged integrated circuit structure. An encapsulation or package may be used to connect the integrated circuit structure (or the semiconductor device) to an external circuit, for dissipating heat generated by the integrated circuit structure (by the semiconductor device), and/or to protect the integrated circuit structure (the semiconductor device) from external influences (e.g. from moisture, dust, or physical damage). Typically used power semiconductor packages may be TO—(transistor outline)—packages (e.g. TO-220, TO-247, TO-262, or TO-3).

According to various embodiments, a contact metallization process may be applied in semiconductor processing to provide electrical contacts (in other words the contact pads) for a semiconductor device, the electrical contacts may be necessary for operating the semiconductor device. A contact metallization (e.g. an ohmic contact or an ohmic contact metallization, e.g. a Schottky-contact) may have direct physical contact with at least one integrated circuit structure, e.g. with a terminal of a transistor or with a terminal of a diode, provided on and/or in a carrier. According to various embodiments, a contact metallization process may include at least one layering process and/or at least one patterning process. According to various embodiments, a contact metallization process may include depositing a layer of a dielectric material (also called an interlayer dielectric, e.g. a low-k dielectric material, e.g. undoped silicate glass, and the like), forming contact holes at the desired locations (e.g. using a patterning process) and filling the contact holes with at least one electrically conductive material (e.g. at least one of a metal (e.g. aluminum, copper, tungsten, titanium, molybdenum, gold, and the like), a metallic material (e.g. titanium nitride, platinum silicide, titanium silicide, tungsten silicide, molybdenum silicide, and the like), electrically conductive silicon (e.g. electrically conductive polysilicon), and a metal alloy (e.g. aluminum-silicon alloys, aluminum-copper alloys, aluminum-silicon-copper alloys, nichrome, titanium-tungsten alloys, and the like)) using a layering process.

Further, according to various embodiments, a metallization process may be applied to generate a single level metallization having one metal layer or a multilevel metallization including a plurality of metal layers after the contact metallization may be provided. According to various embodiments, a metallization process may include at least one layering process and may include at least one patterning process for patterning the deposited layer to provide the desired wiring structure.

Further, according to various embodiments, a metallization process may include forming additional layers for example as a barrier (e.g. including at least one of molybdenum, platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like). Further, according to various embodiments, the formation of a silicide may be self-aligned. According to various embodiments, a metalloid may include boron, silicon, germanium, arsenic, antimony, and tellurium.

The term "noble" used with regards to a "noble" material (e.g. a "noble" metal, "noble" metal alloy, a "noble" metalloid) or as relative reference between different materials more "noble" and less "noble" may be used herein in the sense of the electrochemical series, the electrochemical corrosion, and the standard electrode potential. As relative reference, the following materials are examples ordered by their standard electrode potential (relative to the standard hydrogen electrode under standardized conditions) starting with the least noble material: Mg, Be, Al, Zr, Ti, Mn, V, Nb, Zn, Cr, Ta, Ga, Fe, In, Ni, Sn, Pb, Ge, Bi, Cu, Ag, Pt, Au. According to various embodiments, metals having more than one oxidation state may be characterized herein by the least standard electrode potential with respect to the oxidation states. Further, metals (Me) may be characterized by their standard electrode potential with respect to the same or a similar chemical reaction (redox reaction), e.g. $Me \leftrightarrow Me^{x+} + x \cdot e^-$.

According to various embodiments, metal alloys may have a standard electrode potential depending on their chemical composition and the involved chemical phases. Since, for convention, the standard hydrogen electrode is set to 0.00 V and any electrode (a metal alloy), for which the electrode potential has to be determined, can be paired with the standard hydrogen electrode (or another electrode for which the potential has already been known) in a galvanic cell. As a result, the unknown standard electrode potential can be obtained from the galvanic cell voltage. According to various embodiments, an aluminum/copper alloy may be more noble than aluminum.

In general, to make the properties of an active semiconductor material (of one or more diodes, one or more transistors, one or more thyristors, and the like) available, it may be necessary to electrically contact the active semiconductor material by an appropriate metallization. Typically, an aluminum-based front side metallization may be used for power semiconductor devices. The packaging technology may be in substantial measure to the use of aluminum-based bond wires. Further, a chip or a die (a semiconductor work piece) may be housed or encapsulated in a discrete package (e.g. in a TO-package). Alternatively, a chip or a die may be housed or encapsulated on PCB—(printed circuit board)—level or on module level. According to various embodiments, the packaging of the chips or dies may be performed on wafer level or after dicing the wafer (after singulating the dies or chips from the wafer).

According to various embodiments, a chip, a die, or an integrated circuit structure of a semiconductor device may be at least partially encapsulated (covered, surrounded) with a polymer, e.g. with benzocyclobutene (BCB), silicone, imide (polyimide), and the like. According to various embodiments, a chip or a die may be encapsulated by mold material, e.g. for providing discrete packages, or, alternatively, a chip or a die may be covered or encapsulated by silicone-gel, e.g. for module level packaging.

However, the semiconductor device (e.g. the encapsulated integrated circuit structure) may not be fully protected from moisture by typically used measures, which may cause corrosion of the front side metallization during operation of the integrated circuit structure, wherein the corrosion can spread unhindered through the aluminum-based front side metallization to the active semiconductor region of the semiconductor device (or of the integrated circuit structure), which can lead to failure of the semiconductor device.

According to various embodiments, a metallization may be provided herein for a semiconductor device or for an integrated circuit structure, wherein the metallization may be configured so that a possible corrosion of the metallization may be restricted into a thin layer of the metallization or into a thin layer over the metallization; therefore, the corrosion may not penetrate through the metallization to the active semiconductor material (to the integrated circuit structure), which may prevent or delay the failure of the semiconductor device or the integrated circuit structure. Illustratively, the metallization may be configured so that a possible corrosion may not completely penetrate from an upper surface of the metallization (facing away from the integrated circuit structure and) in contact with the encapsulation material to the integrated circuit structure below the metallization.

Various measures may be typically applied to prevent the unhindered corrosion of a front side metallization. The active region of the semiconductor device may be encapsulated (covered) by a passivation layer including for example silicon oxide, silicon nitride, and/or photo-imide. However, in the area of the bonding wires, for example, such a passivation layer, which is electrically insulating, has to be removed, which in turn may lead to corrosion of the front side metallization again.

Further, since passivation layers, as typically used, may include brittle material, e.g. silicon oxide and/or silicon nitride, mechanical stress or mechanical strain being introduced into the passivation layer during operation, e.g. due to temperature fluctuations and/or thermal expansion, may lead to cracks in the passivation layer. As a result, in regions of the passivation layer including cracks, the effectiveness of the passivation layer may be reduced or vanished so that the metallization may corrode. Therefore, the thickness of the passivation layers and the thickness of the metals may be adapted so that the tensions are kept as low as possible. Further, the layout has to be designed as well so that the tensions are kept as low as possible.

According to various embodiments, the unhindered oxidation of the front side metallization may be prevented by depositing an additional layer (in other words a protection layer) over the actual front side metallization; the front side metallization may have for example a thickness of several micrometers, wherein the additional layer serves as a sacrificial oxidation layer. The additional layer may consist of a metal which is less noble than the metal or metal alloy of the front side metallization. Further, the additional layer may be substantially free of grain boundaries, e.g. the additional layer may include an epitaxially grown metal, e.g. deposited via sputtering. For example, the additional layer may consist of a single metal. Further, the additional layer may cover, surround, or enclose the front side metallization.

According to various embodiments, a metallization, e.g. a front side metallization or alternatively a back side metallization, may include AlCu (a metal alloy including aluminum and copper), wherein the additional layer (the sacrificial layer) deposited over the metallization may be an aluminum layer, e.g. a pure aluminum layer including more than 95% (atom percent or mole percent) aluminum (the purity of metals may be related to metal contaminations). Since the thermal expansion coefficient of aluminum and AlCu are of the same order of magnitude and aluminum may not be brittle (in other words aluminum may be rather soft compared to typical oxides or nitrides), a formation of cracks due to a thermal load can be prevented, according to various embodiments.

As it has been found, that the additional layer being less noble than the metallization may be oxidized first during a moisture exposure or moisture load of the semiconductor device, wherein the oxidation front stops at the interface between the additional layer and the metallization, so that the oxidation proceeds further only in the additional layer serving as sacrificial layer. Only if a large region of the additional layer (e.g. of the aluminum layer) is completely oxidized, the metallization (e.g. including AlCu) may be oxidized as well.

As an example, an oxidation (or deterioration) of an AlCu metallization during a high humidity high temperature reverse bias (H3TRB) test could be observed only after 1500 h if the AlCu metallization is covered with an aluminum (sacrificial) layer, where the semiconductor device was still functional; in contrast, a semiconductor device having an exposed AlCu metallization without an aluminum (sacrificial) layer failed electrically after 700 h to 800 h of the H3TRB test.

According to various embodiments, a thicker protection layer (sacrificial layer) provided over the metallization may extend the life time of the metallization. According to various embodiments, the protection layer (e.g. an aluminum protection layer covering an AlCu metallization) may have a thickness of about 500 nm to pass a 1500 h H3TRB test.

Illustratively, an imide or another polymer covering the metallization may act as a moisture reservoir, and, therefore, in a humid environment the water may dissociate into $H^+$ ($H_3O^+$) ions and into $OH^-$ ions due to (or assisted by) the electrical field surrounding the integrated circuit, wherein the $OH^-$ ions may first oxidize the aluminum over the metallization. If the aluminum is oxidized and the oxidation front reaches the metallization (the AlCu layer or the AlCu wiring), a galvanic cell is generated including the Al and AlCu in this humid environment, wherein aluminum is less noble than AlCu, wherein the $OH^-$ ions cause the oxidation of the less noble aluminum so that the AlCu of the metallization may not be oxidized. The effectiveness of the galvanic cell decreases if a relatively large region of the aluminum is consumed (oxidized) so that the AlCu of the metallization may be oxidized as well. According to various embodiments, a 500 nm aluminum layer deposited over a several microns thick AlCu metallization may significantly enhance the lifetime of the semiconductor device, e.g. from about 750 h to about 1500 h.

Optionally, the protection layer arranged over the metallization may be covered with a further passivation layer after the metallization and the protection layer have been patterned. According to various embodiments, the further passivation layer may include a thin nitride layer or a thin oxide layer, wherein the further passivation layer may be penetrated during a bond process. According to various embodiments, a bond process may be applied to electrically connect bond wires to the additional layer and the metallization. According to various embodiments, the further passivation layer may be patterned by semiconductor patterning processes, e.g. by using a resist mask, or a hard mask, or by a dry etch process (e.g. reactive ion etching) as oxide.

According to various embodiments, the further passivation layer delays the corrosion further and increases the adhesion of an imide or imide layer, which may be formed over the further passivation layer in further processing. Alternatively, the imide or imide layer may be formed over the protection layer (e.g. directly on the protection layer or in direct physical contact with the protection layer). According to various embodiments, forming an imide or imide layer (encapsulating or covering the integrated circuit, the metallization and the protection layer) may include: depositing an imide layer over the protection layer (optionally over the further passivation layer on the protection layer), patterning the imide layer, and performing an imide cyclization process. Illustratively, a patterned cyclized imide layer may be provided for encapsulating the integrated circuit structure of the semiconductor device, e.g. on module level.

According to various embodiments, a power metallization (e.g. an aluminum based power metallization) may be provided, e.g. characteristic in the thickness and in the flanks of the metallization, wherein the power metallization includes a first material (a first metal, a first metal alloy, or a first metalloid), e.g. AlCu, being more noble than a second material (a second metal, a second metal alloy, or a second metalloid), e.g. Al, of a protection layer deposited on the power metallization.

According to various embodiments, the power metallization may be covered with the second material from the protection layer. This may prevent a physical contact between the power metallization and an encapsulation material (e.g. a photoimide) for packaging the integrated circuit. Therefore, the moisture load may not affect the semiconductor device (e.g. the power metallization and the integrated circuit structure) until the protection layer is consumed, since the oxidation front stops at the interface between the protection layer and the power metallization, and therefore, the oxidation front may not enter the power metallization unhindered.

FIG. 1A illustrates a semiconductor device 100 in a schematic cross sectional view according to various embodiments. The semiconductor device 100 may include a layer stack, including a metallization layer 106 and a protection layer 108 covering the metallization layer, wherein the layer stack may be formed at a surface 100a of the semiconductor device 100, wherein the metallization layer 106 may include a first metal or metal alloy. The protection layer may include a second metal or metal alloy, wherein the second metal or metal alloy of the protection layer 108 may be less noble than the first metal or metal alloy of the metallization layer 106. In one or more embodiments, the semiconductor device 100 may include a carrier 102, e.g. a semiconductor carrier 102, e.g. a semiconductor substrate 102, a semiconductor wafer 102, a semiconductor work piece 102, or any other carrier including or being made of semiconductor material, e.g. a semiconductor carrier 102 described herein below in connection with FIGS. 2A and 2B. According to various embodiments, the layer stack may be disposed over, e.g. directly on, the carrier 102.

According to various embodiments, the semiconductor device 100 may include at least one of the following semiconductor devices or may be configured as one of the following semiconductor devices: a two terminal device, e.g. a diode (a PIN diode or a Schottky diode, e.g. a SiC Schottky diode), and/or a three terminal device, e.g. a power MOSFET (metal oxide semiconductor field-effect transistor), a JFET (junction gate field-effect transistor), e.g. a SiC JFET, a thyristor (e.g. in metal oxide semiconductor (MOS) technology), an IGBT (insulated-gate bipolar transistor), and the like. Further, the semiconductor device 100 may include more than three terminals. According to various embodiments, the semiconductor device 100 may be or may include a readily processed integrated circuit or integrated circuit structure in any technology, e.g. in MOS technology or in CMOS (complementary metal oxide semiconductor) technology. Illustratively, the carrier 102 may include one or more components of the semiconductor device 100.

According to various embodiments, the semiconductor device 100 may include at least one contact pad 106, or in other words, the metallization layer 106 may include at least one contact pad 106. The contact pad 106 or the metallization layer 106 may electrically contact the semiconductor device 100 so that the semiconductor device 100 can be operated by the contact pad 106 or by the metallization layer 106. The contact pad 106 or the metallization layer 106 may electrically contact at least one terminal of the semiconductor device 100 (cf. for example FIGS. 2A and 2B).

Figure 2A:
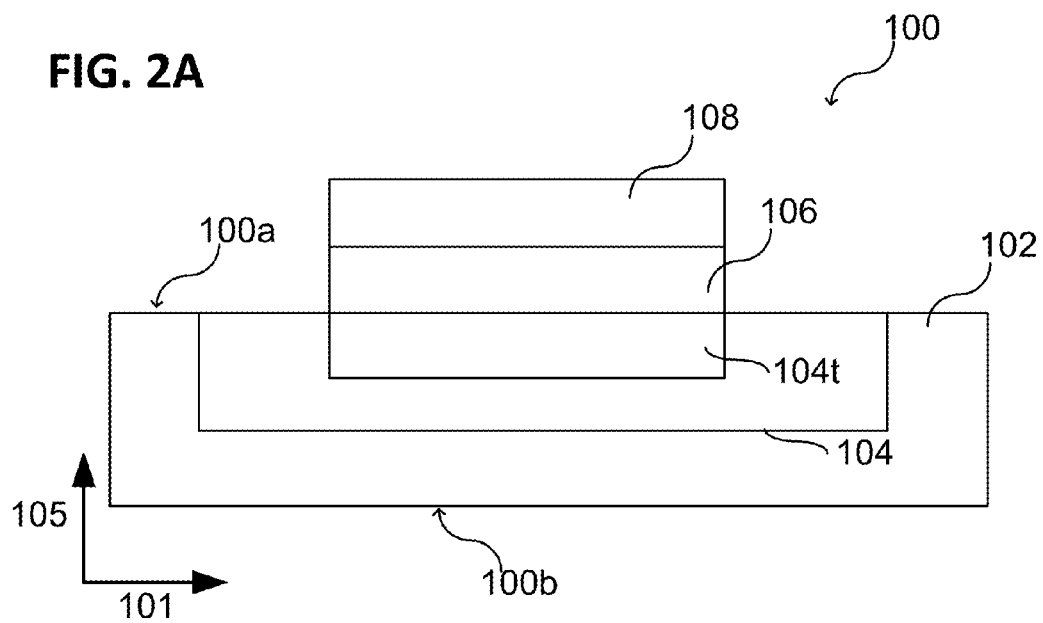
FIGS. 2A and 2B show a semiconductor device respectively in a schematic cross sectional view according to various embodiments.
Figure 2B:
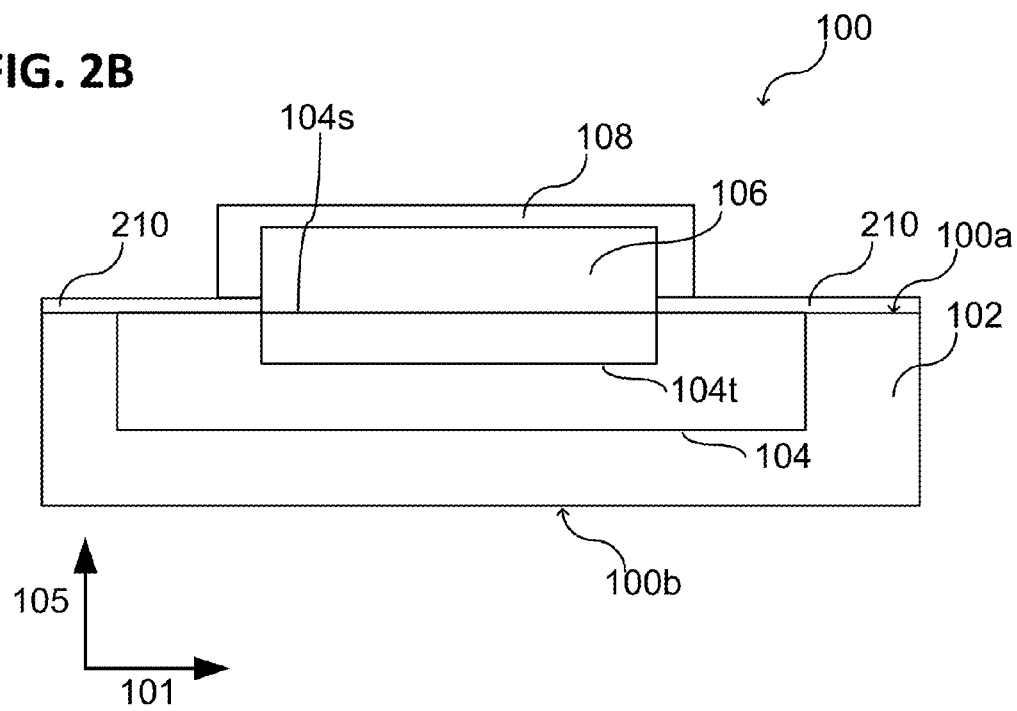

According to various embodiments, the semiconductor device 100 may include a semiconductor substrate 102 (in other words a semiconductor work piece 102), wherein an integrated circuit structure may be provided at least one of over or in the semiconductor substrate 102 (cf. for example FIGS. 2A and 2B).

Further, the metallization layer 106 may be a final metallization layer 106. Illustratively, the metallization layer 106 may include a single metallization layer 106, e.g. a contact metallization providing at least one contact pad 106, or the metallization layer 106 may be the last (in other words, the top or final) metallization layer 106 of a multilevel metallization. In still other words, the metallization layer 106 may be disposed in a final metallization level of the semiconductor device 100. For example, the semiconductor device 100 may include n metallization levels (n being an integer greater than or equal to 1, e.g. greater than or equal to 2, e.g. greater than or equal to 3, etc.), e.g. a first metallization level "Metal 1", a second metallization level "Metal 2", etc., and a last (final) metallization level "Metal n", wherein the metallization layer 106 may be disposed in metallization level "Metal n", i.e. in the last or final metallization level.

According to various embodiments, the protection layer 108 may be the top layer of the metallization, or in other words, the protection layer 108 may be the topmost electrically conductive layer of the semiconductor device 100. According to various embodiments, the semiconductor device 100 may include a plurality of electrically conductive layers, the plurality of electrically conductive layers providing for example one or more contact pads and/or a wiring an integrated circuit structure, wherein the protection layer 108 may be the topmost electrically conductive layer of the plurality of electrically conductive layers.

According to various embodiments, the metallization layer 106 may be a power metallization layer the contact pad 106 may be a power contact pad 106; in other words, the metallization layer 106 or the contact pad may be configured to provide a current greater than 1 A and/or a voltage greater than 20 V to the semiconductor device. Therefore, the power metallization layer or a power contact pad 106 may have a sufficiently large cross section to carry the electrical power (current and voltage) without being damaged.

According to various embodiments, the semiconductor device 100 may be or may include at least one semiconductor device of the following group of semiconductor devices, the group consisting of: a diode; a bipolar transistor; a field effect transistor; an insulated gate bipolar transistor; a thyristor. Further, the semiconductor device 100 may be configured as power semiconductor device 100 to handle a current greater than 1 A and, at the same time, a voltage greater than 400 V or a current greater than 10 A and, at the same time, a voltage greater than 20 V. Illustratively, the metallization may be provided pursuant to the power to be operated by the semiconductor device 100. The semiconductor device 100 may be configured to be operated for example at a power of greater than about 500 W or 1000 W.

Figure 1B:
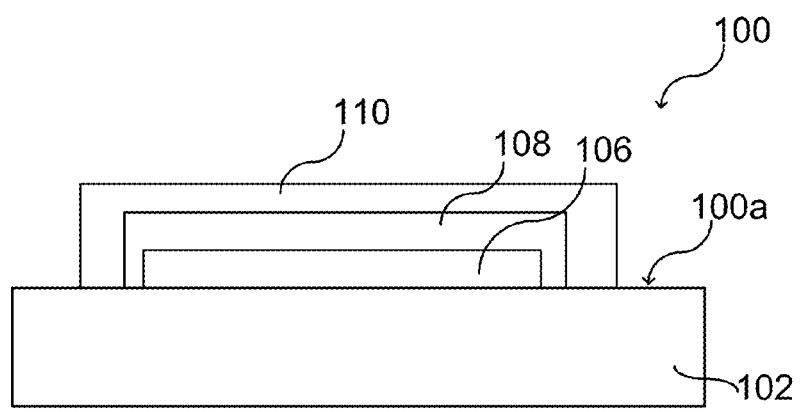
FIGS. 1B and 1C show a semiconductor device respectively in a schematic cross sectional view according to various embodiments.

FIG. 1B illustrates a semiconductor device 100 in a schematic cross sectional view according to various embodiments, wherein the layer stack (including layers 106 and 108) disposed over the carrier 102 (e.g., the semiconductor substrate 102) of the semiconductor device 100 is at least partially encapsulated with an encapsulation material 110 (e.g. with a polymer or another suitable encapsulation material), the encapsulation material 110 may be disposed over the protection layer 108. According to various embodiments, the layer stack may include an encapsulation material layer 110 disposed over the protection layer 108.

According to various embodiments, the first metal or metal alloy forming the metallization layer 106 may include a first standard electrode potential, $E^0{}_1$, and the second metal or metal alloy forming the protection layer 108 may include a second standard electrode potential, $E^0{}_2$, wherein the first standard electrode potential may be greater than the second standard electrode potential. Further, the first standard electrode potential may be greater than or equal to about −1.66 V (or greater than or equal to the standard electrode potential of aluminum). Further, the second standard electrode potential may be less than or equal to about −1.66 V (or less than or equal to the standard electrode potential of aluminum).

According to various embodiments, the metallization layer 106 may include or may consist of an aluminum alloy, the aluminum alloy including aluminum and at least one metal or metalloid being more noble than aluminum. Therefore, according to various embodiments, the first standard electrode potential may greater than the standard electrode potential of aluminum. According to various embodiments, metallization layer 106 may include or may consist of an aluminum/copper alloy, an aluminum/manganese alloy, an aluminum/zinc alloy, an aluminum/silicon alloy, an aluminum/silicon/copper alloy, an aluminum/tin alloy.

Further, the protection layer 108 may include or may consist of aluminum or the protection layer 108 may include or may consist of magnesium. According to various embodiments, the metallization layer 106 may be made of an aluminum/copper alloy and the protection layer 108 may be made of aluminum.

According to various embodiments, water included in the encapsulation material 110 may oxidize the protection layer 108 first, wherein as long as the protection layer 108 is not substantially consumed, the metallization layer 106 may not be oxidized.

According to various embodiments, a semiconductor device 100 may include: a metallization layer 106 formed at a surface 100a of the carrier 102 (e.g. at a surface 100a of a semiconductor substrate 102) of the semiconductor device 100; wherein the metallization layer consists of a metal alloy (therefore having for example a microstructure including a plurality of grain boundaries); and a protection layer 108 covering the metallization layer 106, wherein the protection layer consists of a single metal (therefore having for example a microstructure substantially free of grain boundaries), wherein the metal of the protection layer 108 may be less noble than the metal alloy of the metallization layer 106.

The metal protection layer 108 covering the metallization layer 106 may be substantially free of grain boundaries, e.g. the metal (e.g. aluminum) may be deposited via a sputtering process at temperatures allowing a formation of an epitaxial and/or grain boundary free metal layer. Illustratively, the oxidation processes consuming the protection layer 108 (e.g. due to the water provided from the encapsulation material 110) may be a volume based process, wherein a surface of an AlCu metallization layer 106 exposed directly to the water may be oxidized along the grain boundaries of the grains of the AlCu alloy, and therefore, a directed oxidation may quickly spread through the metallization layer 106 and affecting the semiconductor device 100.

According to various embodiments, the metallization layer 106 (the power metallization) may have a thickness greater than or equal to about 1 μm, wherein the protection layer may have a thickness less than the thickness of the metallization layer 106. According to various embodiments, the metallization layer 106 or the at least one contact pad 106 may be disposed at a front side 100a of the semiconductor device 100 or of the power semiconductor device 100. According to various embodiments, in case the semiconductor device 100 includes a transistor, a source terminal and optionally a gate terminal may be disposed at the front side 100a of the semiconductor device 100.

Figure 1C:
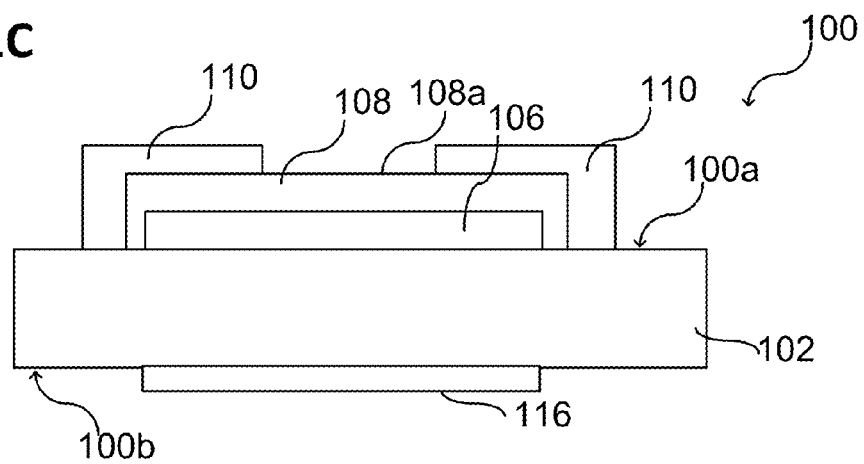

FIG. 1C illustrates a semiconductor device 100 in a schematic cross sectional view according to various embodiments, wherein the semiconductor device 100 may include a back side metallization 116 or a further contact pad 116 at a second surface 100b (a back side) of the semiconductor device 100 opposite the first surface 100a (the front side). According to various embodiments, in case the semiconductor device 100 includes a transistor, a drain terminal may be disposed at the back side 100b of the semiconductor device 100. Illustratively, the back side 100b of the semiconductor device 100 may be defined by the back side of the carrier 102 (e.g. of the semiconductor substrate 102).

Further, according to various embodiments, the encapsulation material 110 may be patterned, e.g. partially removed, so that the protection layer 108 may be partially exposed. This may allow for example to connect a bond wire to the protection layer 108 and therefore to electrically contact the semiconductor device 100.

Various modifications and/or configurations of the semiconductor device 100 and details referring to semiconductor device 100, the metallization layer 106, and the protection layer 108 are described in the following, wherein the features and/or functionalities described with reference to FIGS. 1A to 1C may be included analogously. Further, the features and/or functionalities described in the following may be included in the semiconductor device 100 or may be combined with the semiconductor device 100 as described before with reference to FIGS. 1A to 1C.

FIG. 2A schematically illustrates a semiconductor device 100 in a cross sectional view or side view according to various embodiments. The semiconductor device 100 may include a semiconductor carrier 102, e.g. a semiconductor substrate 102, a semiconductor wafer 102, a semiconductor work piece 102, or any other carrier including semiconductor material 102. The semiconductor device 100 may include at least one integrated circuit structure 104 formed at least one of over or in the semiconductor material 102. Illustratively, a body region of the integrated circuit structure 104 may be provided by any suitable carrier 102, the body region including semiconductor material (e.g. doped or undoped), e.g. silicon, germanium, gallium arsenide, or SiC. According to various embodiments, the semiconductor carrier 102 may include an integrated circuit structure 104 or may be a part of an integrated circuit structure 104. The semiconductor carrier 102 and/or the integrated circuit structure 104 may include at least one of a p-well region or an n-well region (or a p-doped region or an n-doped region). Further, the semiconductor material 102 may be doped so that the integrated circuit structure 104 may include a doped region, e.g. n-type doped or p-type doped region. According to various embodiments, the semiconductor carrier 102 and/or the integrated circuit structure 104 may include or may be configured to provide a transistor, e.g. a field effect transistor, e.g. a bipolar transistor. The semiconductor carrier 102 and/or the integrated circuit structure 104 may include or may be configured to provide at least a part of a high-voltage device, a high-current device, a power device, a sensor, a diode, and the like.

According to various embodiments, the semiconductor carrier 102 and/or the integrated circuit structure 104 may include or may be configured to provide at least one of the following: a readily processed integrated circuit, a CMOS (complementary metal oxide semiconductor) integrated circuit, a bipolar transistor, an IGBT, and/or a micro-electromechanical system (MEMS), or another component or another structure, as for example, a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, a nano-electronic device, an electrical circuit, a digital circuit, an analog circuit, and any other electronic device based on semiconductor technology.

According to various embodiments, the integrated circuit structure 104 may include at least one terminal 104t for operating the integrated circuit structure 104. The integrated circuit structure 104 may include two terminals, e.g. if the integrated circuit structure 104 includes or provides a two terminal device (e.g. a diode), or the integrated circuit structure 104 may include three terminals, e.g. if the integrated circuit structure 104 includes or provides a three terminal device (e.g. a transistor), or the integrated circuit structure 104 may include four terminals, e.g. if the integrated circuit structure 104 includes or provides a four terminal device. As illustrated in FIG. 2A, the semiconductor device 100 may have a lateral extension 101 and a height 105 or a thickness 105 perpendicular to the lateral extension 101. The semiconductor carrier 102 may define a first side 100a (or a first surface 100a) of the semiconductor device 100 and a second side 100b (or second surface 100b) of the semiconductor device 100 opposite the first side 100a. According to various embodiments, the first surface 100a may be a main processing surface of the semiconductor carrier 102 (also called front side). According to various embodiments, the semiconductor carrier 102 may include a semiconductor wafer covered with an epitaxially grown semiconductor layer.

According to various embodiments, the semiconductor device 100 may include a metallization layer 106 (in other words a metallization structure) formed over the at least one integrated circuit structure 104 or formed over the first side 100a of the semiconductor carrier 102 to electrically contact the at least one terminal 104t. In one embodiment, the metallization layer 106 may be in direct physical contact with the at least one terminal 104t, or in other words, the metallization layer 106 may be or may include a contact metallization.

According to various embodiments, the semiconductor device 100 or the semiconductor carrier 102 may include a plurality of integrated circuit structures 104, wherein the metallization layer 106 may provide a wiring for electrically contacting the plurality of integrated circuit structures 104 and for connecting at least two integrated circuit structures 104 of the plurality of integrated circuit structures 104 with each other. Illustratively, the metallization layer 106 may be configured to operate the single integrated circuit structure 104 or to operate the plurality of integrated circuit structures 104 as desired.

According to various embodiments, the metallization layer 106 may include or may consist of a first metal or the metallization layer 106 may include or may consist of a first metal alloy. According to various embodiments, the metallization layer 106 may include a dielectric material and metal lines (a wiring) embedded in the dielectric material. According to various embodiments, the metallization layer 106 may be formed by patterning a first metal layer, the first metal layer being deposited over the integrated circuit structure 104, over the at least one terminal 104t of the integrated circuit structure 104 and/or over the first side 100a of the semiconductor carrier 102.

According to various embodiments, the semiconductor device 100 may include a protection layer 108 covering the metallization layer 106. The protection layer 108 may be in direct physical contact with the metallization layer 106. Alternatively, additional electrically conductive layers or materials may be disposed between the protection layer 108 and the metallization layer 106 and/or between the metallization layer 106 and the at least one terminal 104t of the integrated circuit structure 104, e.g. as barrier layers or adhesion promoter layers.

According to various embodiments, the protection layer 108 may include or may consist of a second metal or the protection layer 108 may include or may consist of a second metal alloy, wherein the second metal or the second metal alloy is less noble than the first metal or the first metal alloy of the metallization layer 106. According to various embodiments, the protection layer 108 may be formed by patterning a second metal layer, the second metal layer being deposited over the metallization layer 106. According to various embodiments, the protection layer 108 may at least partially cover the metallization layer 106, wherein in this case, exposed sides or surface regions of the metallization layer 106 may be covered by another material or material layer.

According to various embodiments, the metallization layer 106 and the protection layer 108 may be formed by depositing a first metal layer over the integrated circuit structure 104 and by depositing a second metal layer over the first metal layer, and by patterning both metal layers subsequently. The metal layers may be deposited by chemical vapor deposition (CVD) or by physical vapor deposition (PVD), e.g. using a sputter process.

According to various embodiments, the metallization layer 106 and the protection layer 108 may be formed by depositing a first metal alloy layer over the integrated circuit structure 104 and by depositing a second metal alloy layer over the first metal alloy layer, and by patterning both metal alloy layers subsequently. The metal alloy layers may be deposited by chemical vapor deposition (CVD) or by physical vapor deposition (PVD), e.g. using a sputter process.

According to various embodiments, the metallization layer 106 and the protection layer 108 may be formed by depositing a metal alloy layer over the integrated circuit structure 104 and by depositing a metal layer over the metal alloy layer, and by patterning both layers subsequently. The metal alloy layer and the metal layer may be deposited by chemical vapor deposition (CVD) or by physical vapor deposition (PVD), e.g. using a sputter process.

Various modifications and/or configurations of the semiconductor device 100 and details referring to integrated circuit structure 104, the metallization layer 106, and the protection layer 108 are described in the following, wherein the features and/or functionalities described with reference to FIGS. 1A to 1C and FIG. 2A may be included analogously. Further, the features and/or functionalities described in the following may be included in the semiconductor device 100 or may be combined with the semiconductor device 100 as described with reference to FIGS. 1A to 1C and FIG. 2A.

FIG. 2B schematically illustrates a semiconductor device 100 in a cross sectional view or side view according to various embodiments, the semiconductor device 100 including at least one integrated circuit structure 104 formed over and/or in a semiconductor carrier 102. The first surface 100a of the semiconductor carrier 102 and/or the integrated circuit structure 104 may be partially covered with a dielectric material 210 (e.g. with an interlayer dielectric, ILD). The protection layer 108 may partially surround the metallization layer 106 so that the metallization layer 106 is completely enclosed. In other words, the metallization layer 106 may not have an exposed surface before the encapsulation material 110 is provided over the first surface 100a of the semiconductor carrier 102. The metallization layer 106 may be embedded into the material of the protection layer 108 so that the sides or surfaces of the metallization layer 106 facing away from the semiconductor carrier 102 are covered with the protection layer 108 or with the protection layer 108 and the dielectric material 210.

Figure 3A:
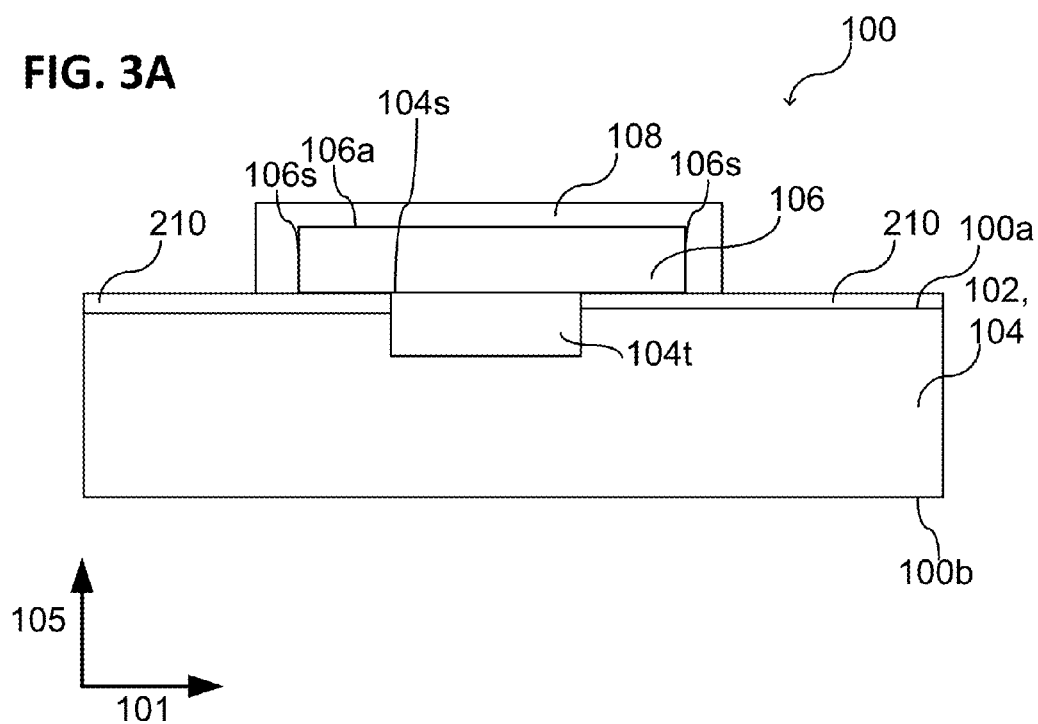
FIGS. 3A and 3B show a semiconductor device respectively in a schematic cross sectional view according to various embodiments.

FIG. 3A schematically illustrates a semiconductor device 100 in a cross sectional view or side view according to various embodiments, the semiconductor device 100 including at least one integrated circuit structure 104 formed over and/or in a semiconductor carrier 102. Illustratively, the metallization layer 106 may provide a contact pad 106 over (e.g. directly on) the at least one terminal 104t of the integrated circuit structure 104. The contact pad 106 may have a lateral extension along the direction 101 being greater than the lateral extension of the at least one terminal 104t. Alternatively, the contact pad 106 may have a lateral extension along the direction 101 being substantially the same as the lateral extension of the at least one terminal 104t (cf. FIGS. 1A to 1C and FIGS. 2A and 2B). Alternatively, the contact pad 106 may have a lateral extension along the direction 101 being less than the lateral extension of the at least one terminal 104t (not shown in figures).

According to various embodiments, the semiconductor carrier 102 may be partially covered with the dielectric material 210, wherein the dielectric material 210 may include openings for electrically contacting the at least one terminal 104t of the integrated circuit structure 104 formed in and/or over the semiconductor carrier 102. As illustrated in FIG. 3A, the protection layer 108 may cover the surface 106a of the contact pad 106 facing away from the semiconductor device 100 and the sidewalls 106s of the contact pad 106 facing into a lateral direction.

Figure 3B:
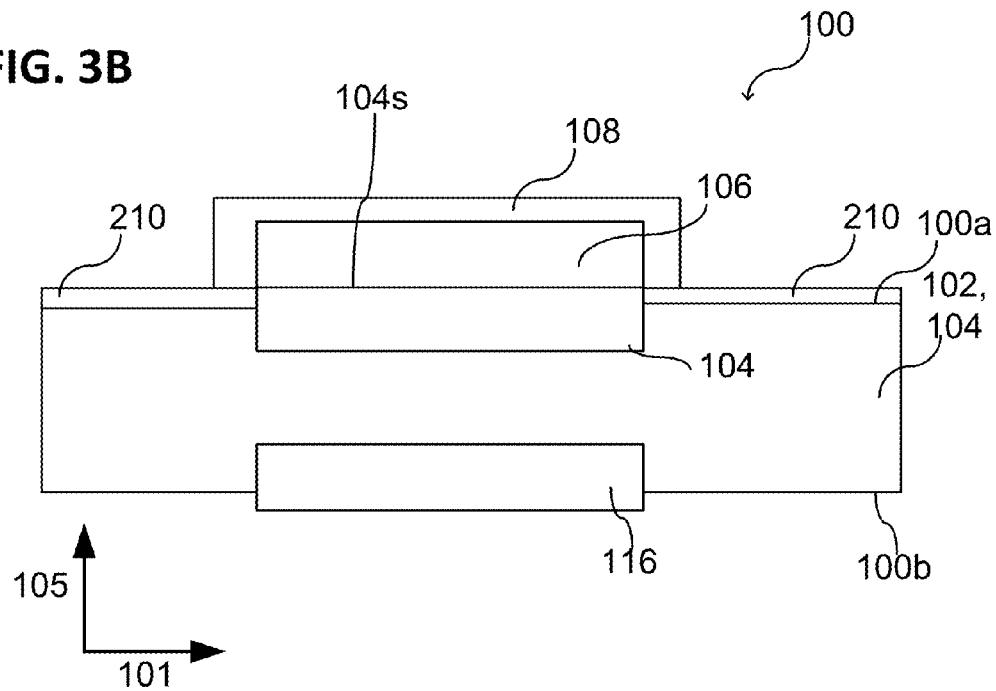

FIG. 3B schematically illustrates a semiconductor device 100 in a cross sectional view or side view according to various embodiments, the semiconductor device 100 including at least one integrated circuit structure 104 formed over and/or in a semiconductor carrier 102. The semiconductor device 100 may include a front side metallization layer 106 at the first surface 100a of the semiconductor carrier 102 and a back side contact 116 at the second surface 100*b* of the semiconductor carrier 102. The semiconductor device 100 (and therefore accordingly the integrated circuit structure 104) may be configured as electronically vertical device (with a current flow from the front side 100*a* of the semiconductor device 100 to the back side 100*b* of the semiconductor device 100). The semiconductor carrier 102 may have a thickness (e.g. perpendicular to the first side 100*a* and/or to the second side 100*b*) in the range from about 25 µm to about 400 µm, e.g. in the range from about 30 µm to about 300 µm, or the thickness of the semiconductor carrier 102 may be less than about 100 µm.

As illustrated herein, for example in FIGS. 2A, 2B, 3A and 3B, the metallization layer 106 (or the contact pad 106) may extend away from the first surface 100*a* of the semiconductor carrier 102. According to various embodiments, the metallization layer 106 (or the contact pad 106) may have a height (along the direction 105) in the range from about 1 µm to about 20 µm, e.g. in the range from about 2 µm to about 15 µm, e.g. in the range from about 3 µm to about 10 µm, e.g. in the range from about 4 µm to about 6 µm. According to various embodiments, the at least one terminal 104*t* of the integrated circuit structure 104 may have a width (along the direction 101) in the range from about 1 µm to about 100 µm, wherein the width of the metallization layer 106 or the width of the contact pad 106 may be greater than the width of the at least one terminal 104*t*. According to various embodiments, the metallization layer 106 or the contact pad 106 may extend over (and therefore electrically contact) a plurality of terminals or a terminal structure including more than one terminal. According to various embodiments, the protection layer 108 may have a height (along the direction 105) or thickness in the range from about 0.1 µm to about 5 µm, e.g. in the range from about 0.1 µm to about 2 µm, e.g. in the range from about 0.1 µm to about 1 µm, e.g. in the range from about 0.4 µm to about 0.6 µm. According to various embodiments, the height or thickness of the protection layer 108 may be less than the height or thickness of the metallization layer 106. Illustratively, the metallization layer 106 may be configured to allow a current flow and to provide a voltage as desired for operating the integrated circuit structure 104, e.g. the metallization layer 106 may be a power metallization to provide a current greater than 1 A and/or a voltage greater than 20 V to the integrated circuit structure 104.

FIG. 4 schematically illustrates a semiconductor device 100 in a cross sectional view or side view according to various embodiments. The semiconductor device 100 may include a plurality of integrated circuit structures 104, the integrated circuit structures 104 may be arranged laterally next to each other on and/or in the semiconductor carrier 102.

According to various embodiments, the integrated circuit structures 104 may be electrically contacted by the metallization layer 106, wherein the metallization layer 106 may electrically contact the integrated circuit structures 104 individually or wherein the metallization layer 106 may electrically connect the integrated circuit structures 104 with each other. According to various embodiments, the protection layer 108 may be electrically conductive (may include electrically conductive material, e.g. aluminum).

According to various embodiments, the semiconductor device 100, e.g. including the semiconductor carrier 102, the integrated circuit structure 104 with the at least one terminal 104*t*, the metallization layer 106, and the protection layer 108 may be at least partially encapsulated (molded) in a packaging process.

FIG. 5 illustrates a semiconductor device 100 in a cross sectional view or side view according to various embodiments, wherein the semiconductor device 100 is partially encapsulated (in other words molded or embedded) into encapsulation material 110 (also called molding material 110 or mold 110). According to various embodiments, the front side 100*a* of the semiconductor device 100 may be covered with encapsulation (molding) material 110. The encapsulation material 110 may include a polymer, e.g. imide or BCB, as already described. The encapsulation material 110 may further include water, e.g. absorbed by the polymer. According to various embodiments, the semiconductor device 100 may be a die or a chip (e.g. singulated from a wafer), wherein the semiconductor device 100 may be completely encapsulated with encapsulation material 110. Further, the semiconductor device 100 may be packaged on module level, wherein at least the front side 100*a* of the semiconductor device 100 may be encapsulated (covered or partially covered) with encapsulation material 110. According to various embodiments, the encapsulation material 110 may be in direct physical contact with the protection layer 108 or, alternatively, a further passivation layer (e.g. an oxide or nitride layer) may be disposed between the encapsulation material 110 and the protection layer 108, wherein the further passivation layer may be configured (patterned or partially opened) to allow a current flow into the protection layer 108.

According to various embodiments, the protection layer 108 may completely spatially separate the metallization layer 106 from the encapsulation material 110. Illustratively, the water from the encapsulation material 110 may not have direct contact to the metallization layer 106 so that the protection layer 108 may serve as sacrificial electrode, as already described. The protection layer 108 may laterally surround the metallization layer 106 (the contact pad 106) and may cover the metallization layer 106 (contact pad 106) completely.

Figure 6A:
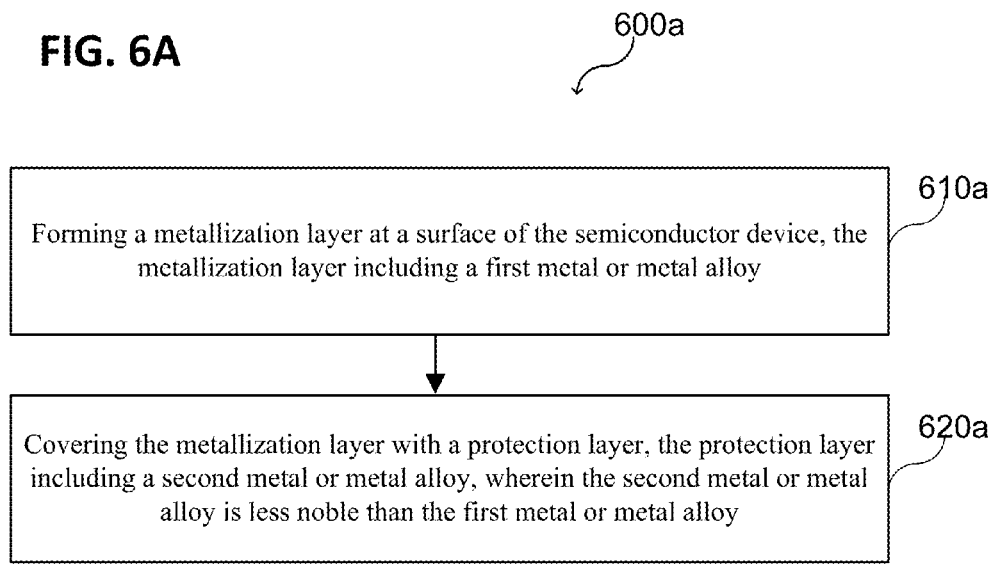
FIG. 6A shows a method for processing a semiconductor device in a schematic flow diagram according to various embodiments.

FIG. 6A illustrates a schematic flow diagram of a method 600*a* for processing a semiconductor device 100 according to various embodiments. The method 600*a* may include, in 610*a*, forming a metallization layer 106 at a surface 100*a* of the semiconductor device 100, the metallization layer 106 including a first metal or metal alloy; and, in 620*a*, covering the metallization layer 106 with a protection layer 108, the protection layer 108 including a second metal or metal alloy, wherein the second metal or metal alloy is less noble than the first metal or metal alloy.

Figure 6B:
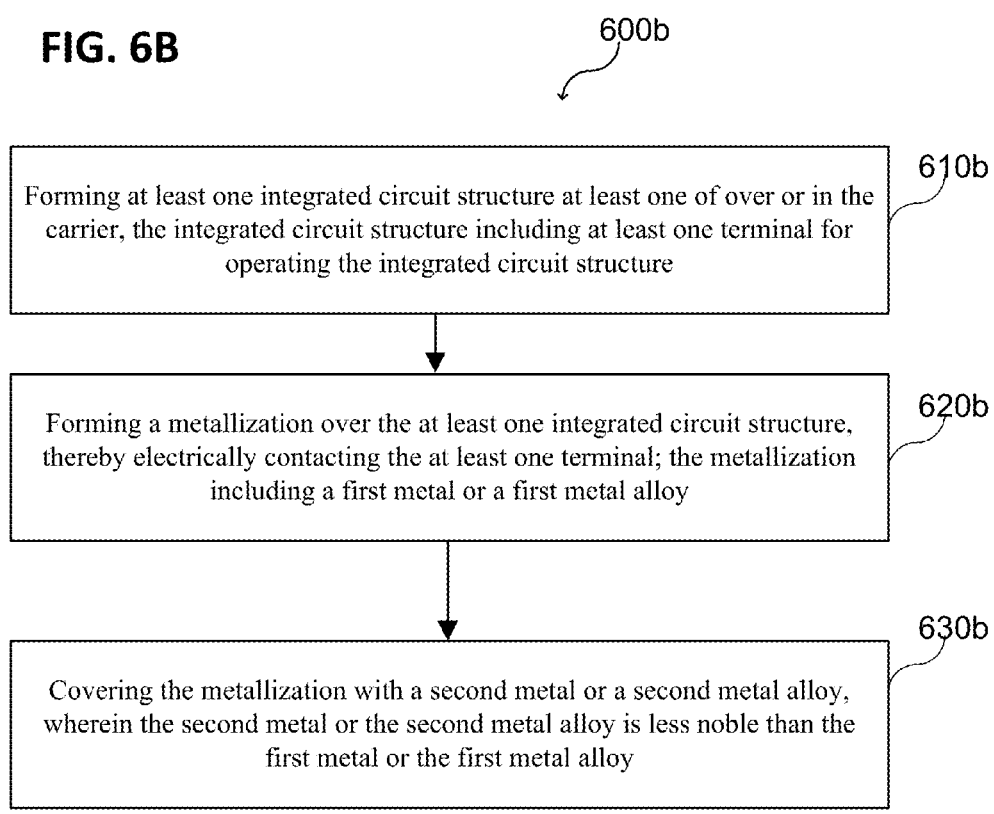
FIG. 6B shows a method for processing a semiconductor device in a schematic flow diagram according to various embodiments.

FIG. 6B illustrates a schematic flow diagram of a method 600*b* for processing a semiconductor device 100, a method 600*b* for manufacture of a semiconductor device 100, method 600*b* for processing a semiconductor work piece 102. According to various embodiments, the method 600*b* may include: in 610*b*, forming at least one integrated circuit structure 104 at least one of over or in the semiconductor carrier 102 (the integrated circuit structure 104 may be formed at least one of over and in the semiconductor carrier 102), the integrated circuit structure 104 may include at least one terminal 104*t* for operating the integrated circuit structure 104; in 620*b*, forming a metallization layer 106 over the at least one integrated circuit structure 104, thereby electrically contacting the at least one terminal 104*t*; the metallization layer 106 may include a first metal or metal alloy; and, in 630*b*, covering the metallization layer 106 with a second metal or metal alloy, wherein the second metal or metal alloy is less noble than the first metal or metal alloy.

In the following, FIGS. 7A to 7E illustrate a semiconductor device 100 or a semiconductor work piece 102 (e.g. a JFET) respectively in a schematic cross sectional view at various stages during manufacture, according to various embodiments. Illustratively, FIGS. 7A to 7E illustrate a semiconductor device 100 or a semiconductor work piece 102 respectively at various stages during processing (e.g. during method 600*a* or method 600*b* is carried out).

Figure 7A:
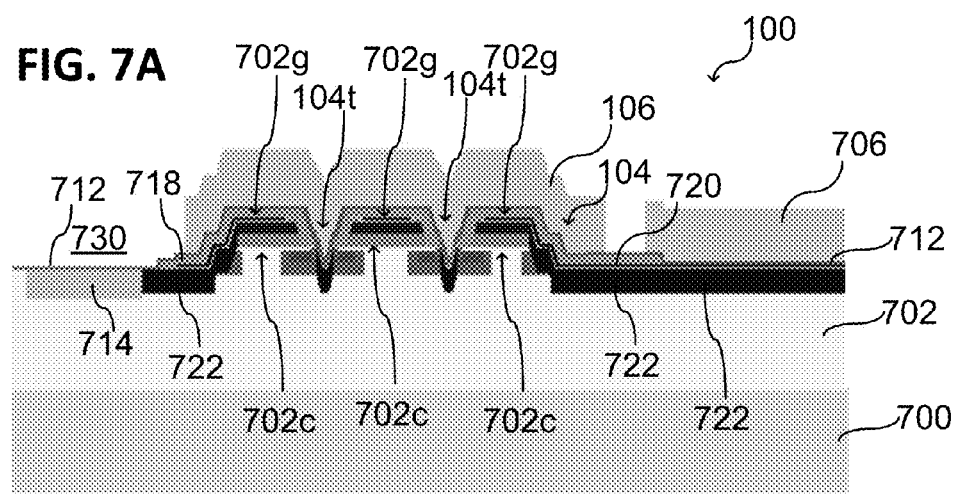
FIGS. 7A to 7E show a semiconductor device respectively in a schematic cross sectional view at various stages during processing according to various embodiments.

As illustrated in FIG. 7A, the semiconductor device 100 may include a first body region 700 and a second body region 702, the first body region 700 may include for example $n^{++}$-doped SiC (e.g. provided by an $n^{++}$-doped SiC wafer 700) and the second body region 702 may include for example n-doped SiC. The second body region 702 may be an epitaxial SiC-layer deposited over the first body region 700 (over the SiC wafer 700). The semiconductor device 100 may further include a junction extension termination 714, e.g. in a border area 730 of the integrated circuit structure 104 or in a border area 730 of the semiconductor device 100. According to various embodiments, the semiconductor device 100 may include at least one transistor structure 104 providing one or more channel regions 702*c* in the second body region 702, the one or more channel regions 702*c* may be controlled by one or more gate regions 702*g* over the channel regions 702*c*.

According to various embodiments, the semiconductor device 100 (e.g. the second body region 702) may be covered with a liner structure 712 (e.g. with a titanium liner having a thickness in the range from about 100 nm to about 200 nm). The one or more gate regions 702*g* may be separated (electrically isolated) from the liner structure 712 and therefore from the metallization layer 106 by at least one dielectric layer 718. The one or more gate regions 702*g* may be electrically contacted and electrically connected to a gate pad 706 by a metal layer 720 (e.g. a molybdenum layer) and an electrically conductive region 722 (e.g. $p^+$-doped SiC) in the second body region 702. According to various embodiments, the transistor structure 104 may include a terminal (e.g. one or more terminal regions) 104*t*, the terminal 104*t* being electrically contacted by the liner structure 712 and the metallization layer 106 (or the contact pad 106) on the liner structure 712. Forming the liner structure 712 and the metallization layer 106 may include depositing a titanium layer 712 over the transistor structure 104 (over the semiconductor device 100), the titanium layer 712 having for example a thickness of about 150 nm, and, subsequently, depositing an AlCu layer 106 over the titanium layer 712, the AlCu layer 106 having for example a thickness of about 5 μm. The AlCu layer may include aluminum and copper. According to various embodiments, an AlCu layer having a higher copper content (molar percent) may be more noble (nobler) than an AlCu layer having less copper content, e.g. the copper content may be related to the substance amount.

According to various embodiments, the metallization layer 106 (the AlCu power metallization layer 106) may be patterned to provide a source pad 106 electrically contacting the terminal 104*t*, wherein the terminal 104*t* may be the source terminal structure 104*t* of the transistor structure 104, and to provide a gate pad 706 electrically contacting the one or more gate regions 702*g*. Patterning the metallization layer 106 may include a photolithographic process (e.g. applying a resist and patterning the resist to provide a soft mask) and a wet etch process (AlCu wet etching) performed subsequently. Further, the junction termination extension 714 may be covered (and protected) by the titanium liner 712. The junction termination extension 714 may be a $p^-$-doped region in the second body region 702.

Figure 7B:
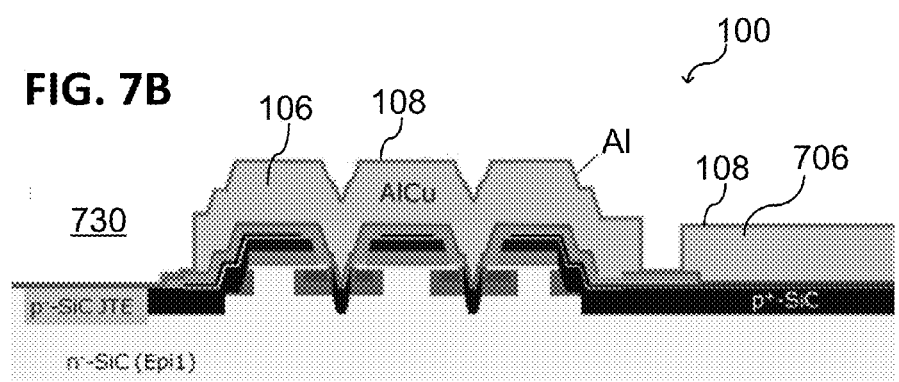

As illustrated in FIG. 7B, a protection layer 108, e.g. an aluminum layer 108, may be deposited over the patterned metallization layer 106, e.g. over the patterned AlCu power metallization. According to various embodiments, the protection layer 108 may be deposited over the semiconductor device 100 covering the source pad 106, wherein the source pad 106 may be provided by the patterned AlCu power metallization layer 106, and the gate pad 706, wherein the gate pad 706 may be provided by the patterned AlCu power metallization layer 106. As an example, the aluminum of the protection layer 108 and the AlCu of the metallization layer 106 may provide together a metallization structure, wherein the aluminum may provide a sacrificial oxidation layer due to being less noble than the Al/Cu alloy. According to various embodiments, the Al/Cu alloy providing the source pad 106 may be completely covered by the aluminum of the protection layer 108.

Figure 7C:
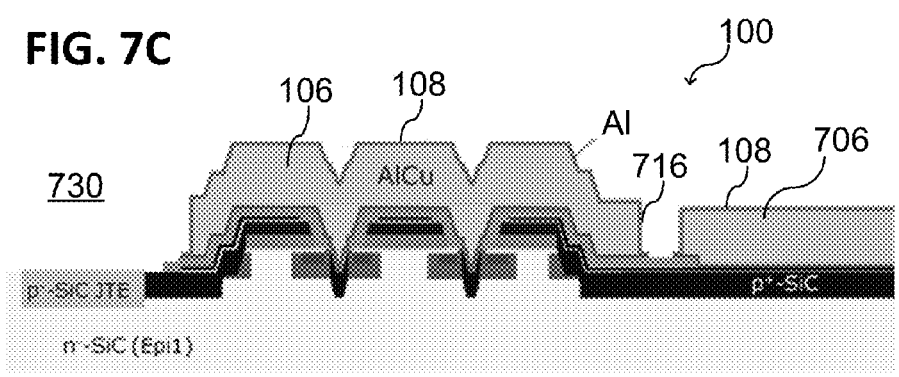

As illustrated in FIG. 7C, the aluminum layer 108 and the titanium liner 712 may be patterned to electrically separate the source pad 106 from the gate pad 706. Patterning the aluminum layer 108 may include a photolithographic process (e.g. applying a resist and patterning the resist to provide a soft mask) and a wet etch process performed subsequently, e.g. aluminum wet etching. The aluminum layer 108 may be patterned after the metallization layer 106 has been patterned, which may allow using a wet etch process to pattern the aluminum layer 108. After the aluminum layer 108 has been patterned, the titanium liner 712 may be patterned by dry etching, e.g. by reactive ion etching.

According to various embodiments, the AlCu layer 106 may be patterned so that the flank 716 does not exceed a critical angle; therefore, a closed coverage of the patterned AlCu layer (e.g. providing the source pad 106) may be achieved by the subsequently deposited aluminum layer 108. Further, the aluminum layer 108 may be sufficiently thick to obtain a sufficient sacrificial oxidation; the aluminum layer 108 may have for example a thickness greater than 300 nm, greater than 400 nm, greater than 500 nm, or even greater than 1 μm.

According to various embodiments, the protection layer 108 deposited over the semiconductor device 100 may be partially removed to covered the at least one source pad 106 including the first metal or metal alloy with the second metal or metal alloy. Further, the protection layer 108 deposited over the semiconductor device 100 may be partially removed to cover a gate pad 706 including the first metal or metal alloy with the second metal or metal alloy. The source pad 106 and/or the gate pad 706 may electrically contact the source terminal 104*t* and the gate terminal 702*g* of the transistor structure 104. In analogy, a drain pad 106 may electrically contact a drain terminal of the transistor structure 104 (not illustrated in FIG. 7C).

Figure 7D:
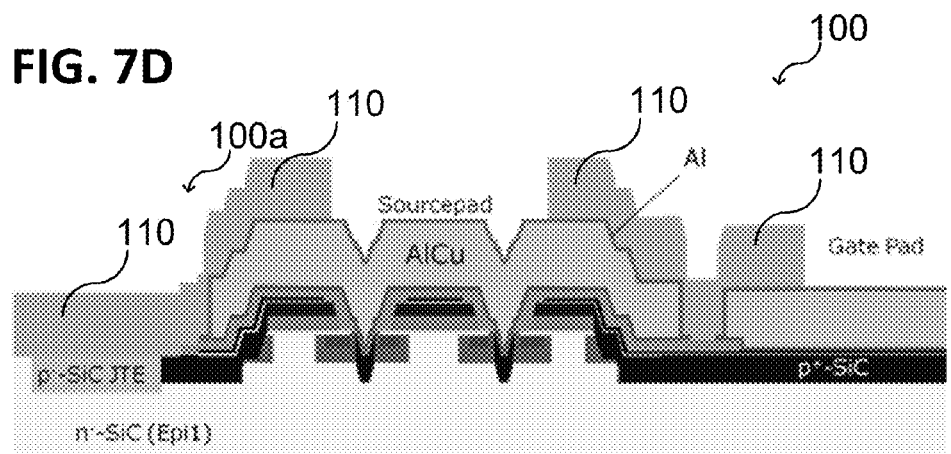

As illustrated in FIG. 7D, an encapsulation material 110, e.g. photoimide, may be deposited over the semiconductor device 100, the deposited encapsulation material 110 covering the transistor structure 104. Subsequently, the encapsulation material 110 may be patterned (partially removed) to at least partially expose the source pad 106 and the gate pad 706 covered with the aluminum layer 108 for electrically contacting. The encapsulation material 110 may be patterned by applying a photolithographic patterning process.

Since the titanium liner 712 may be patterned by a dry etch process, according to various embodiments, an under etch of the aluminum layer 108 may be prevented. Therefore, a formation of a gap in which moisture could accumulate (e.g. below the aluminum layer 108 or below the titanium liner 712) may be prevented.

According to various embodiments, FIG. 7D illustrates a semiconductor device 100, e.g. a SiC JFET, after the front side processing has been finished. The front side 100a may be passivated by the patterned polymer layer 110.

Figure 7E:
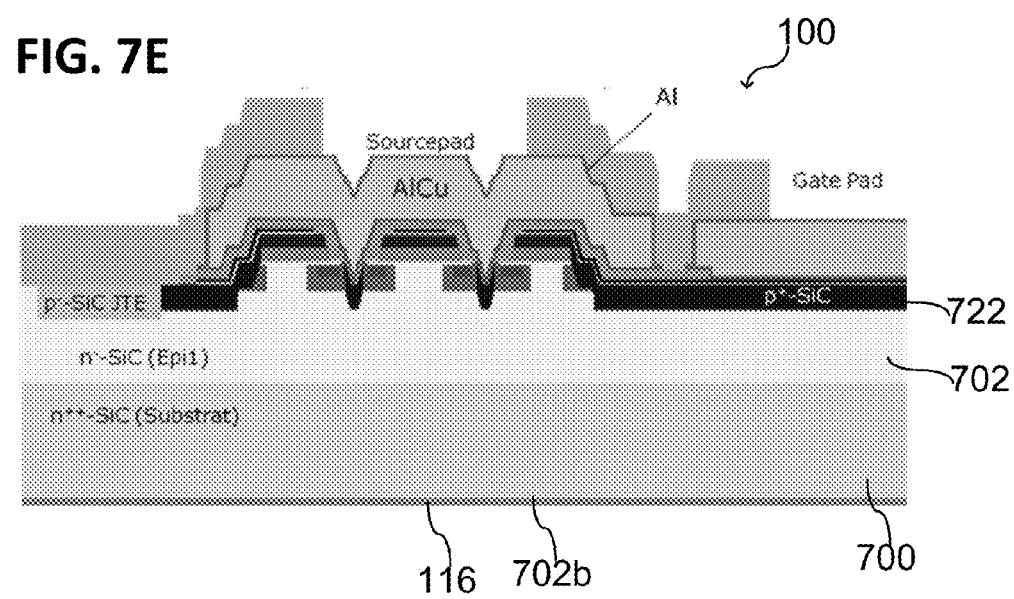

As illustrated in FIG. 7E, a back side processing may be performed to provide a readily processed electronic device 100, e.g. a readily processed SiC JFET. Therefore, the first body region, e.g. the wafer 700, may be thinned to the desired thickness if necessary, e.g. the wafer 700 may have a thickness less than 100 μm or less than 50 μm after thinning. Subsequently, a back side metallization 116 may be deposited over a back side 700b of the SiC wafer 700 (e.g. over the back side 700b of the thinned wafer 700). Subsequently, the back side metallization 116 may be activated, e.g. via rapid thermal processing (RTP).

In a modification, one or more additional layers (e.g. additional metal layers or metal nitride layers, patterned oxide layers, or patterned nitride layers) can be used as buffer layer, barrier layer or the like, which do not affect the functionality of the semiconductor device 100.

According to various embodiments, carrier 102 (e.g. a semiconductor substrate 102 or a semiconductor work piece 102) may include: at least one integrated circuit structure 104 formed at least one of over or in the carrier 102, the integrated circuit structure 104 may include at least one terminal 104t for operating the integrated circuit structure 104; a metallization layer 106 formed over the at least one integrated circuit structure 104 to electrically contact the at least one terminal 104t; the metallization layer 106 may include a first metal or a first metal alloy; and a protection layer 108 covering the metallization layer 106, the protection layer 108 may include a second metal or a second metal alloy, wherein the second metal or the second metal alloy is less noble than the first metal or the first metal alloy.

Further, the integrated circuit structure 104 may include at least one of the following: a diode; a bipolar transistor; a field effect transistor; an insulated gate bipolar transistor; a thyristor. Further, the integrated circuit structure 104 may be configured as power integrated circuit structure to handle for example an electrical current greater than about 1 A and/or an electrical voltage greater than about 20 V. Further, the integrated circuit structure 104 may be configured as power integrated circuit structure to handle for example an electrical current greater than about 2 A and/or an electrical voltage greater than about 30 V.

According to various embodiments, the carrier 102 may further include at least one electrically conductive liner structure (e.g. a titanium liner) or barrier layer disposed between the metallization layer 106 and the at least one terminal 104t.

Further, the integrated circuit structure 104 may include a transistor structure and the at least one terminal 104t may be a source/drain terminal of the transistor structure.

According to various embodiments, an electronic device 100 may include: at least one integrated transistor structure 104 including two source/drain terminals 104t for operating the integrated transistor structure 104; a contact metallization layer 106 or a contact pad 106 including a first metal or metal alloy, the metallization layer 106 or the contact pad 106 electrically contacting at least one source/drain terminal 104t of the two source/drain terminals 104t, a protection layer 108 covering the metallization layer 106 or the contact pad 106, the protection layer 108 including a second metal or metal alloy, wherein the second metal or metal alloy is less noble than the first metal or metal alloy.

According to various embodiments, a method for processing a carrier 102 (or for processing a semiconductor work piece) may include: forming at least one integrated circuit structure 104 at least one of over or in the carrier 102, the integrated circuit structure 104 may include at least one terminal 104t for operating the integrated circuit structure 104; forming a metallization layer 106 over the at least one integrated circuit structure 104, thereby electrically contacting the at least one terminal 104t; the metallization layer 106 may include a first metal or metal alloy; covering the metallization layer 106 with a second metal or metal alloy, wherein the second metal or metal alloy may be less noble than the first metal or metal alloy.

According to various embodiments, the metallization layer 106 may be configured as power metallization 106 to provide an electrical current greater than about 1 A and/or an electrical voltage greater than about 20 V to the integrated circuit structure 104.

According to various embodiments, the carrier 102 or the semiconductor device 100 may further include an encapsulation layer 110 formed over the protection layer 108 or covering the protection layer 108, the encapsulation layer including encapsulation material. Further, the protection layer 108 may spatially separate the encapsulation material of the encapsulation layer 110 from the first metal or metal alloy of the metallization layer 106.

According to various embodiments, a semiconductor device 100 may include: a metallization layer 106 formed at a surface 100a of the semiconductor device 100, the metallization layer 106 may include a first metal or metal alloy; a protection layer 108 covering the metallization layer 106, the protection layer 108 may include a second metal or metal alloy, wherein the second metal or metal alloy may be less noble than the first metal or metal alloy.

Further, the metallization layer 106 may be a final metallization layer 106. The metallization layer 106 may be a single layer metallization 106 or the top (in other words, last or final) metallization layer 106 of a multi-level metallization. In other words, the metallization layer 106 may be disposed in a final metallization level of the semiconductor device 100. For example, the semiconductor device may include n metallization levels (n being an integer greater than or equal to 1, e.g. greater than or equal to 2), e.g. a first metallization level "Metal 1", a second metallization level "Metal 2", etc., and a last (final) metallization level "Metal n", wherein the metallization layer 106 may be disposed in metallization level "Metal n", i.e. in the last or final metallization level. According to various embodiments, the protection layer 108 may be the topmost electrically conductive layer of the semiconductor device 100.

Further, the metallization layer 106 may be configured as power metallization layer 106 to provide (in other words to supply) an electrical current greater than about 1 A to the semiconductor device 100. Further, the metallization layer 106 may be configured as power metallization layer 106 to provide (in other words to supply) an electrical current greater than about 1 A and/or an electrical voltage greater than about 20 V to the semiconductor device 100.

Further, the semiconductor device 100 may include at least one of the following: a diode; a bipolar transistor; a field effect transistor; an insulated gate bipolar transistor; a thyristor. Further, the semiconductor device 100 may include at least one of the following: a diode; a bipolar transistor; a field effect transistor; a thyristor.

Further, the semiconductor device 100 may be configured as power semiconductor device 100 to handle an electrical current greater than about 1 A and an electrical greater than about 20 V.

According to various embodiments, the semiconductor device 100 may further include at least one of an electrically conductive liner 712 or an electrically conductive diffusion barrier 712 disposed between the metallization layer 106 and the surface 100*a* of the semiconductor device 100. According to various embodiments, the semiconductor device 100 may further include at least one of an electrically conductive liner or an electrically conductive diffusion barrier, wherein the metallization layer 106 may be disposed on the at least one of the electrically conductive liner or electrically conductive diffusion barrier. Further, the electrically conductive liner may be a titanium liner.

According to various embodiments, the semiconductor device 100 may further include an encapsulation material 110 formed over the protection layer 108. The encapsulation material 110 may partially cover the protection layer 108. The encapsulation material 110 may be patterned such that a portion of the protection layer 108 may be exposed to connect a bond wire (e.g. an aluminum bond wire) to the protection layer 108. In other words, the semiconductor device 100 may further include an encapsulation layer 110 at least partially covering the protection layer 108.

Further, the encapsulation material 110 may include or may consist of a polymer, e.g. imide. In other words, the encapsulation layer 110 may include or may consist of a polymer, e.g. imide.

According to various embodiments, the first metal or metal alloy may have a first standard electrode potential and the second metal or metal alloy may have a second standard electrode potential, wherein the first standard electrode potential may be greater than the second standard electrode potential. Further, the first standard electrode potential may be greater than or equal to about −1.66 V or, in other words, greater than or equal to about the standard electrode potential of aluminum.

Further, the second standard electrode potential may be less than or equal to about −1.66 V or, in other words, less than or equal to about the standard electrode potential of aluminum.

According to various embodiments, the metallization layer 106 may include or may consist of an aluminum alloy, the aluminum alloy including aluminum and at least one metal or metalloid that is more noble (nobler) than aluminum.

Further, the aluminum alloy may include at least one aluminum alloy of the following group of aluminum alloys, the group consisting of: an aluminum/copper alloy, an aluminum/manganese alloy, an aluminum/zinc alloy, an aluminum/silicon alloy, an aluminum/silicon/copper alloy, an aluminum/tin alloy.

According to various embodiments, the protection layer 108 may include at least one of aluminum or magnesium. The protection layer 108 may be made of aluminum or may be made of magnesium (e.g. the protection layer 108 may consist of a single metal or of a substantially pure metal).

According to various embodiments, the metallization layer 106 may be made of an aluminum/copper alloy (AlCu) and the protection layer 108 may be made of aluminum.

According to various embodiments, the metallization layer 106 may have a thickness greater than or equal to about 1 μm. Further, the protection layer 108 may have a thickness less than the thickness of the metallization layer 106.

According to various embodiments, the metallization layer 106 may include a contact pad.

According to various embodiments, a semiconductor device 100, e.g. a power semiconductor device 100, may include: at least one contact pad 106 including a first metal or metal alloy (e.g. disposed at the front side of the power semiconductor device), and a protection layer 108 covering the contact pad 106, the protection layer 108 including a second metal or metal alloy, wherein the second metal or metal alloy may be less noble than the first metal or metal alloy.

Further, the at least one contact pad 106 of the (e.g., power) semiconductor device 100 may include aluminum or an aluminum alloy. Further, the at least one contact pad 106 of the (e.g., power) semiconductor device 100 may consist of aluminum or may consist of an aluminum alloy.

According to various embodiments, a power semiconductor device may include a power metallization layer including an aluminum alloy; and an aluminum layer covering the power metallization layer. The aluminum layer may be in direct physical contact with the power metallization layer. The power semiconductor device may further include a photoimide layer at least partially covering the aluminum layer. According to various embodiments, a power metallization layer may include at least one wire or lead.

According to various embodiments, a method 600*a* of processing a semiconductor device or a method of processing a power semiconductor device may include: forming a metallization layer 106 at a surface 100*a* of the semiconductor device 100, the metallization layer 106 including a first metal or metal alloy; covering the metallization layer 106 with a protection layer 108, the protection layer including a second metal or metal alloy, wherein the second metal or metal alloy may be less noble than the first metal or metal alloy.

According to various embodiments, the protection layer may be also referred to as sacrificial layer or sacrificial oxidation layer.

According to various embodiments, a semiconductor device (e.g., a power semiconductor device) may include: a final metallization layer including a first metal or metal alloy, and a protection layer covering the final metallization layer, the protection layer including a second metal or metal alloy, wherein the second metal or metal alloy may be less noble than the first metal or metal alloy.

According to various embodiments, a semiconductor device (e.g., a power semiconductor device) may include: a metallization layer, the metallization layer including a first metal or metal alloy; and a protection layer disposed on the metallization layer, the protection layer including a second metal or metal alloy, wherein the second metal or metal alloy may be less noble than the first metal or metal alloy. The protection layer may include at least a portion of a surface of the semiconductor device. In one or more embodiments, at least a portion of the protection layer may be exposed.

According to various embodiments, a layer stack of a semiconductor device may include: a metallization layer and a protection layer covering the metallization layer, wherein the metallization layer may include a first metal or metal alloy, and wherein the protection layer may include a second metal or metal alloy, wherein the second metal or metal alloy is less noble than the first metal or metal alloy. The layer stack of the semiconductor device may further include an encapsulation material layer disposed over (e.g. directly on) the protection layer.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device comprising:
a layer stack formed at a surface of the semiconductor device, the layer stack comprising:
a metallization layer, the metallization layer comprising an aluminum alloy; and
a protection layer disposed directly on the metallization layer, the protection layer comprising a metal or metal alloy, wherein the metal or metal alloy is less noble than the aluminum alloy.

2. The semiconductor device according to claim 1, wherein the metallization layer is a final metallization layer.

3. The semiconductor device according to claim 1, wherein the metallization layer is configured as power metallization layer to carry an electrical current greater than about 1 A.

4. The semiconductor device according to claim 1, wherein the semiconductor device comprises at least one semiconductor device of the following group of semiconductor devices, the group consisting of:
a diode;
a bipolar transistor;
a field effect transistor;
an insulated gate bipolar transistor; and
a thyristor.

5. The semiconductor device according to claim 1, wherein the semiconductor device is configured as power semiconductor device to handle at least one of an electrical current greater than about 1 A or an electrical voltage greater than about 20 V.

6. The semiconductor device according to claim 1, further comprising:
at least one of an electrically conductive liner or an electrically conductive diffusion barrier, wherein the metallization layer is disposed on the at least one of the electrically conductive liner or electrically conductive diffusion barrier.

7. The semiconductor device according to claim 1, further comprising:
an encapsulation layer at least partially covering the protection layer.

8. The semiconductor device according to claim 7, wherein the encapsulation layer comprises a polymer.

9. The semiconductor device according to claim 1, wherein the first metal or metal alloy comprises a first standard electrode potential and wherein the second metal or metal alloy comprises a second standard electrode potential, wherein the first standard electrode potential is greater than the second standard electrode potential.

10. The semiconductor device according to claim 9, wherein the first standard electrode potential is greater than or equal to about −1.66 V.

11. The semiconductor device according to claim 9, wherein the second standard electrode potential is less than or equal to about −1.66 V.

12. The semiconductor device according to claim 1, the aluminum alloy comprising aluminum and at least one metal or metalloid that is more noble than aluminum.

13. The semiconductor device according to claim 12, wherein the aluminum alloy comprises at least one aluminum alloy of the following group of aluminum alloys, the group consisting of:
an aluminum/copper alloy,
an aluminum/manganese alloy,
an aluminum/zinc alloy,
an aluminum/silicon alloy,
an aluminum/silicon/copper alloy,
an aluminum/tin alloy.

14. The semiconductor device according to claim 1, wherein the protection layer comprises at least one of aluminum or magnesium.

15. The semiconductor device according to claim 1, wherein the metallization layer is made of an aluminum/copper alloy and wherein the protection layer is made of aluminum.

16. The semiconductor device according to claim 1, wherein the metallization layer has a thickness greater than or equal to about 1 μm.

17. The semiconductor device according to claim 1, wherein the protection layer has a thickness less than the thickness of the metallization layer.

18. A semiconductor device, comprising:
a final metallization layer comprising an aluminum alloy, and
a protection layer disposed directly on the final metallization layer, the protection layer comprising a metal or metal alloy, wherein the metal or metal alloy is less noble than the aluminum alloy.

19. A power semiconductor device comprising:
a power metallization layer comprising a contact pad; the contact pad comprising an aluminum/copper alloy; and
an at least 95% pure aluminum cover layer disposed directly on the contact pad of the power metallization layer.

* * * * *